(12) United States Patent
Tomonari et al.

(10) Patent No.: US 11,670,746 B2
(45) Date of Patent: Jun. 6, 2023

(54) LIGHT EMITTING DEVICE

(71) Applicant: NICHIA CORPORATION, Anan (JP)

(72) Inventors: Masakatsu Tomonari, Anan (JP); Masahiko Sano, Anan (JP)

(73) Assignee: NICHIA CORPORATION, Anan (JP)

( * ) Notice: Subject to any disclaimer, the term of this patent is extended or adjusted under 35 U.S.C. 154(b) by 35 days.

(21) Appl. No.: 17/161,508

(22) Filed: Jan. 28, 2021

(65) Prior Publication Data

US 2021/0151644 A1 May 20, 2021

Related U.S. Application Data

(60) Division of application No. 16/683,113, filed on Nov. 13, 2019, now Pat. No. 10,944,030, which is a
(Continued)

(30) Foreign Application Priority Data

Nov. 30, 2015 (JP) ................................ 2015-234242
Feb. 5, 2016 (JP) ................................ 2016-020421

(51) Int. Cl.
*H01L 33/54* (2010.01)
*H01L 33/60* (2010.01)
(Continued)

(52) U.S. Cl.
CPC .......... *H01L 33/54* (2013.01); *H01L 25/0753* (2013.01); *H01L 33/08* (2013.01);
(Continued)

(58) Field of Classification Search
CPC ......... H01L 33/50; H01L 33/52; H01L 33/54; H01L 33/08; H01L 33/60; H01L 33/62
See application file for complete search history.

(56) References Cited

U.S. PATENT DOCUMENTS 7,300,182 B2 11/2007 Mazzochette
8,786,172 B2 7/2014 Tsutsumi et al.
(Continued)

FOREIGN PATENT DOCUMENTS

EP 2618391 7/2013
JP 2008-527713 7/2008
(Continued)

OTHER PUBLICATIONS

Election of Species requirement issued by the U.S. Patent and Trademark Office for the U.S. Appl. No. 15/364,657, filed Nov. 13, 2017.
(Continued)

*Primary Examiner* — Phat X Cao
(74) *Attorney, Agent, or Firm* — Mori & Ward, LLP

(57) ABSTRACT

A light emitting device including a mounting board, one or more light emitting elements, a light transmissive member, and a light reflective member. The light emitting element(s) are mounted on the mounting board, and each include an upper surface. The light transmissive member is bonded to the upper surface of each of the light emitting element(s). The light transmissive member has an upper surface and a lower surface, and allows light from the light emitting element(s) to be incident on the lower surface of the light transmissive member and to be output from the upper surface of the light transmissive member. The light reflective member covers surfaces of the light transmissive member and lateral surfaces of the light emitting element(s) and exposes the upper surface of the light transmissive member. At least a first portion of the mounting board is exposed from the light reflective member in a plan view.

20 Claims, 12 Drawing Sheets

Related U.S. Application Data continuation of application No. 15/364,657, filed on Nov. 30, 2016, now Pat. No. 10,510,934.

(51) Int. Cl.

| | | |
|---|---|---|
| *H01L 33/08* | (2010.01) | |
| *H01L 33/50* | (2010.01) | |
| *H01L 33/52* | (2010.01) | |
| *H01L 33/62* | (2010.01) | |
| *H01L 33/58* | (2010.01) | |
| *H01L 33/46* | (2010.01) | |
| *H01L 25/075* | (2006.01) | |
| *H01L 33/28* | (2010.01) | |
| *H01L 33/30* | (2010.01) | |
| *H01L 33/32* | (2010.01) | |
| *H01L 33/64* | (2010.01) | |
| *H01L 33/48* | (2010.01) | |

(52) U.S. Cl.
CPC .............. *H01L 33/28* (2013.01); *H01L 33/30* (2013.01); *H01L 33/32* (2013.01); *H01L 33/46* (2013.01); *H01L 33/50* (2013.01); *H01L 33/502* (2013.01); *H01L 33/52* (2013.01); *H01L 33/58* (2013.01); *H01L 33/60* (2013.01); *H01L 33/62* (2013.01); *H01L 33/647* (2013.01); *H01L 33/486* (2013.01); *H01L 33/505* (2013.01); *H01L 33/642* (2013.01); *H01L 33/644* (2013.01); *H01L 2224/16225* (2013.01)

(56) References Cited

U.S. PATENT DOCUMENTS

| | | | |
|---|---|---|---|
| 10,510,934 B2 | 12/2019 | Tomonari et al. | |
| 2005/0174544 A1 | 8/2005 | Mazzochette | |
| 2009/0001490 A1* | 1/2009 | Bogner | F21S 41/151 257/E23.079 |
| 2010/0264438 A1 | 10/2010 | Suenaga | |
| 2010/0320479 A1 | 12/2010 | Minato et al. | |
| 2011/0062469 A1 | 3/2011 | Camras et al. | |
| 2011/0210369 A1 | 9/2011 | Daicho et al. | |
| 2011/0309388 A1 | 12/2011 | Ito et al. | |
| 2012/0112220 A1* | 5/2012 | West | H01L 33/502 257/E33.072 |
| 2013/0121009 A1 | 5/2013 | Tsutsumi et al. | |
| 2013/0188381 A1 | 7/2013 | Kotani | |
| 2014/0203306 A1* | 7/2014 | Ito | H01L 33/60 257/98 |
| 2014/0226308 A1 | 8/2014 | Fukuda et al. | |
| 2015/0102366 A1 | 4/2015 | Wada | |
| 2017/0365746 A1 | 12/2017 | Vampola et al. | |

FOREIGN PATENT DOCUMENTS

| | | |
|---|---|---|
| JP | 2010-219324 | 9/2010 |
| JP | 2010-272847 | 12/2010 |
| JP | 2011-108589 | 6/2011 |
| JP | 2012-004303 | 1/2012 |
| JP | 2012-038889 | 2/2012 |
| JP | 2012-079840 | 4/2012 |
| JP | 2012-134355 | 7/2012 |
| JP | 2013-105877 | 5/2013 |
| JP | 2013-149906 | 8/2013 |
| JP | 2013-179132 | 9/2013 |
| JP | 2014-197690 | 10/2014 |
| JP | 2015-008329 | 1/2015 |
| JP | 2015-079805 | 4/2015 |
| WO | WO 2009/115998 | 9/2009 |
| WO | WO 2010/044240 | 4/2010 |
| WO | WO 2013/061511 | 5/2013 |
| WO | WO 2014/171277 | 10/2014 |
| WO | WO 2016/094422 | 6/2016 |

OTHER PUBLICATIONS

Office Action with Form PTO-892 Notice of References Cited issued by the U.S. Patent and Trademark Office for the U.S. Appl. No. 15/364,657, dated Mar. 1, 2018.

Office Action issued by the U.S. Patent and Trademark Office for the U.S. Appl. No. 15/364,657, dated Oct. 31, 2018.

Advisory Action issued by the U.S. Patent and Trademark Office for the U.S. Appl. No. 15/364,657, dated Feb. 7, 2019.

Office Action with Form PTO-892 Notice of References Cited issued by the U.S. Patent and Trademark Office for the U.S. Appl. No. 15/364,657, dated Mar. 15, 2019.

Notice of Allowance issued by the United States Patent and Trademark Office for the U.S. Appl. No. 15/364,657, dated Aug. 14, 2019.

Election of Species requirement issued by the U.S. Patent and Trademark Office for the parent U.S. Appl. No. 16/683,113, filed Jan. 30, 2020.

Office Action with Form PTO-892 Notice of References Cited issued by the U.S. Patent and Trademark Office for the parent U.S. Appl. No. 16/683,113, dated May 27, 2020.

Notice of Allowance issued by the United States Patent and Trademark Office for the parent U.S. Appl. No. 16/683,113, dated Oct. 30, 2020.

* cited by examiner

LIGHT EMITTING DEVICE

CROSS-REFERENCE TO RELATED APPLICATION

This present application is a divisional application of U.S. application Ser. No. 16/683,113, filed on Nov. 13, 2019, which is a continuation application of U.S. application Ser. No. 15/364,657, filed on Nov. 30, 2016 and issued as U.S. Pat. No. 10,510,934, which claims priority under 35 U. S. C. § 119 to Japanese Patent Application No. 2015-234242, filed on Nov. 30, 2015 and Japanese Patent Application No. 2016-020421, filed on Feb. 5, 2016. The contents of these applications are incorporated herein by reference in their entirety.

BACKGROUND

Technical Field

The present disclosure relates to a light emitting device.

Discussion of the Background

Active use of light emitting devices employing semiconductor light emitting elements is on the rise not only in lighting applications, but also in automotive headlight applications as their optical outputs are increased.

For example, Japanese Patent Publication No. 5482378 proposes a light emitting device having a light transmissive member disposed in contact with a light emitting element and a light reflective resin which covers at least a portion of the light transmissive member. In this light emitting device, the peripheral lateral surfaces of the light transmissive member are oblique surfaces which spread out from the upper surface to the lower surface, and the lower surface of the light transmissive member has a larger area than the upper surface area of the light emitting element. In the light emitting device, moreover, the lower surface of the light transmissive member and the upper surface of the light emitting element are bonded together, and the light reflective resin covers the portion of the lower surface of the light transmissive member which is not bonded to the light emitting element as well as the oblique surfaces.

SUMMARY

According to one aspect of the present invention, a light emitting device includes a mounting board, one or more light emitting elements, a light transmissive member, and a light reflective member. The one or more light emitting elements are mounted on the mounting board. The one or more light emitting elements each includes an upper surface as a light extraction surface. The light transmissive member is bonded to the upper surface of each of the one or more light emitting elements. The light transmissive member has an upper surface and a lower surface, and allows light from the one or more light emitting elements to be incident on the lower surface of the light transmissive member and to be output from the upper surface of the light transmissive member. The light reflective member covers surfaces of the light transmissive member and lateral surfaces of the one or more light emitting elements so as to expose the upper surface of the light transmissive member. At least a first portion of the mounting board is exposed from the light reflective member in a plan view.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings.

DESCRIPTION OF THE EMBODIMENTS

Figure 1:
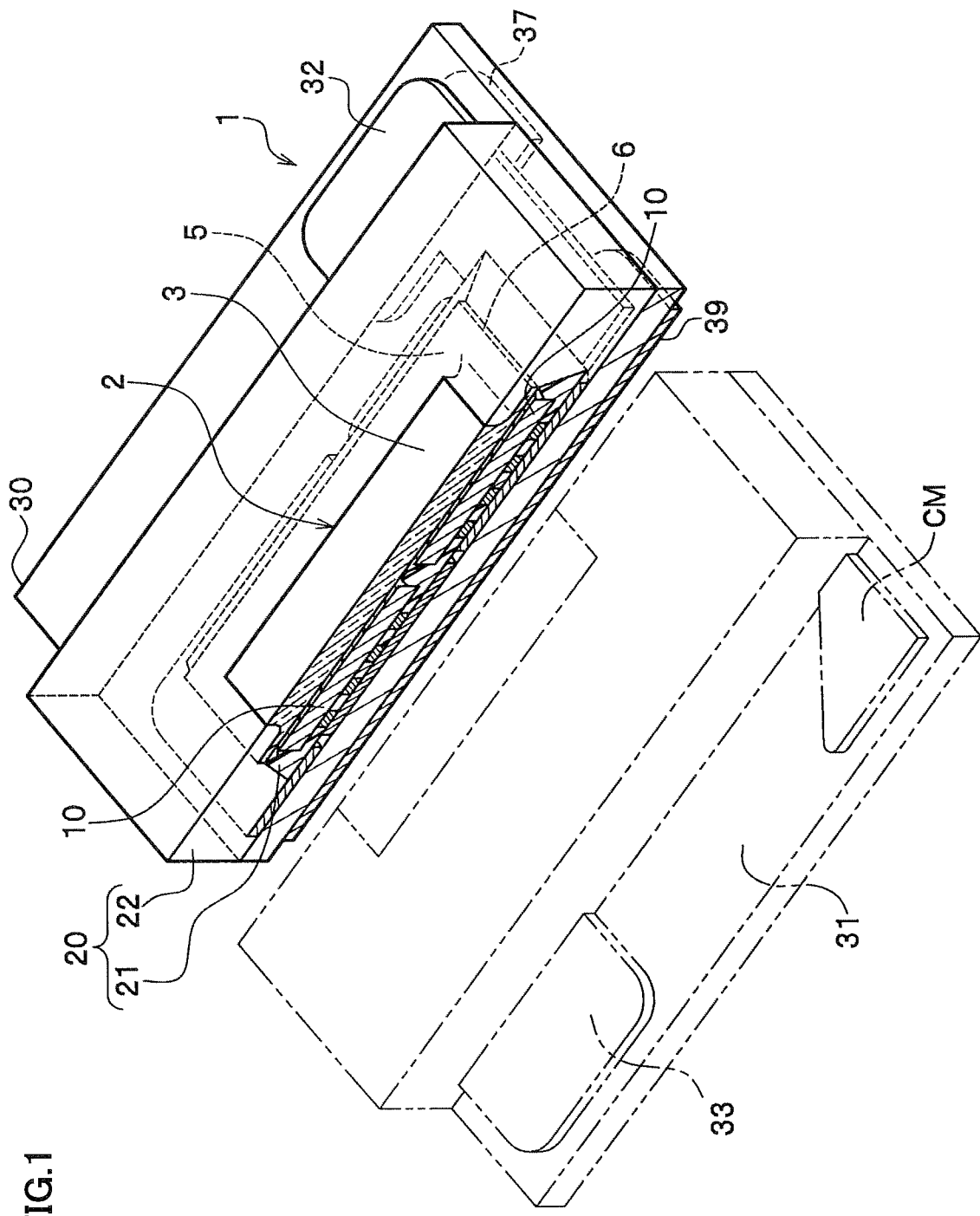
FIG. 1 is a schematic perspective view of the light emitting device according to Embodiment 1 showing a portion in cross section.

The embodiments will now be described with reference to the accompanying drawings, wherein like reference numerals designate corresponding or identical elements throughout the various drawings.

The light emitting device according to each embodiment will be explained below with reference to the drawings. Since the drawings referenced below are schematic illustrations of the embodiments, the scale of the members, and spacing and positional relationship between them may be exaggerated, or some members may be omitted.

Moreover, in the explanation below, the same designations and reference numerals denote the same or similar members, as a rule, and a detailed explanation is omitted when appropriate. The directions indicated in each drawing represent the relative positions of the constituent elements, and are not intended to show their absolute positions.

Embodiment 1

An example of the light emitting device according to Embodiment 1 will be explained with reference to FIG. 1 to FIG. 7.

Figure 2:
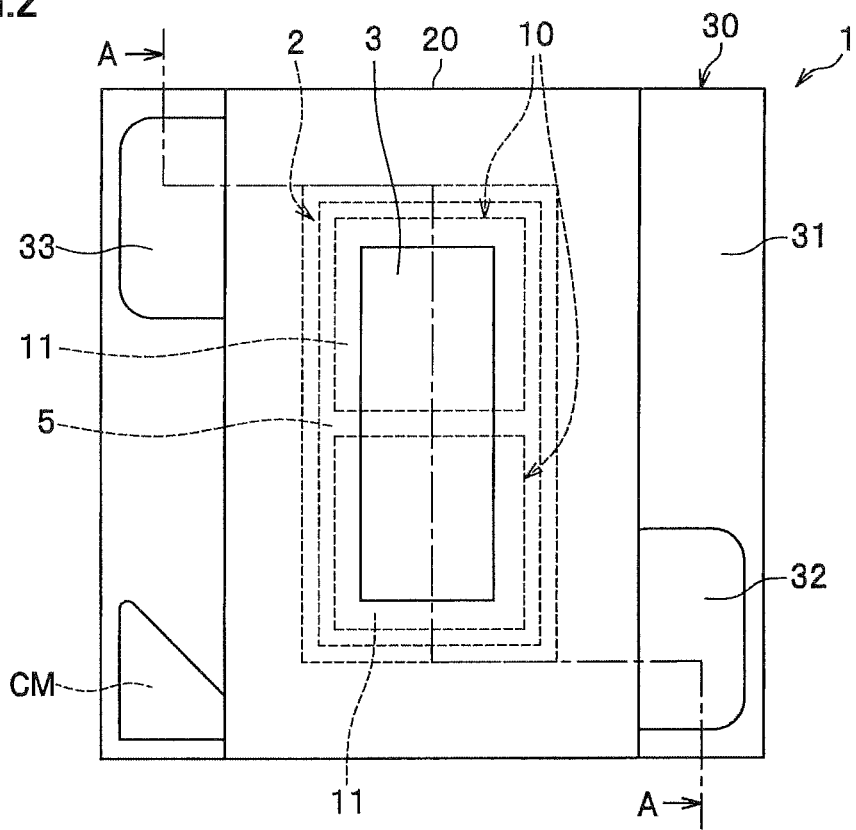
FIG. 2 is a schematic plan view of the light emitting device according to Embodiment 1.
Figure 3:
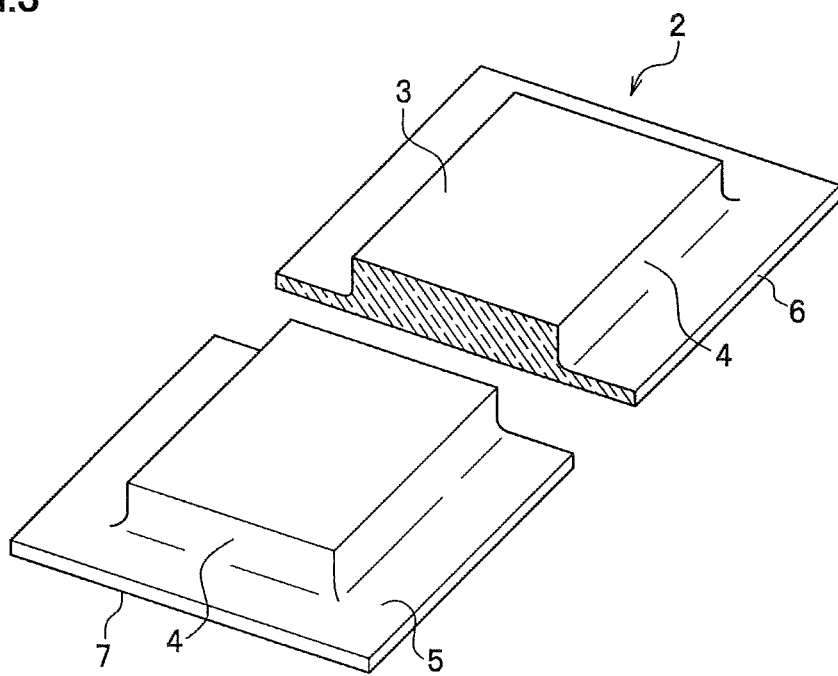
FIG. 3 is a schematic perspective view of the light transmissive member of the light emitting device according to Embodiment 1 showing a portion in cross section.

As shown in FIG. 1 and FIG. 2, the light emitting device 1 primarily has one or more light emitting elements 10; a light transmissive member 2 which allows the light from the light emitting elements 10 to be incident on the lower surface 7 and be output from the upper surface 3; and a light reflective member 20 which covers the surface of the light transmissive member and the lateral surfaces of the light emitting element 10 while exposing the upper surface 3 of the light transmissive member 2. Here, the light emitting device 1 further includes a mounting board 30 for mounting the light emitting element 10.

Light Emitting Element

Any light emitting element known in the art can be used for the light emitting element 10, and it is preferable to use, for example, a light emitting diode. For the light emitting element 10, moreover, one having any given wavelength can be selected. For example, one employing ZnSe, a nitride semiconductor ($In_XAl_YGa_{1-X-Y}N$, $0 \leq X$, $0 \leq Y$, $X+Y \leq 1$), or GaP can be used as a blue or green light emitting element. For a red light emitting element, GaAlAs, AlInGaP, or the like can be used. The light emitting element 10 can alternatively be a semiconductor light emitting element composed of materials other than those mentioned above. The composition, the emission color, the size, and the number of the light emitting elements 10 can be appropriately selected in accordance with the objective to be achieved. The light emitting element 10 preferably has a set of positive and negative electrodes on the same side. This allows for the light emitting element 10 to be flip-chip mounted on the mounting board. In this case, the surface which opposes the surface with the set of electrodes formed thereon becomes the primary light extraction surface 11 of the light emitting element. In the case where the light emitting element 10 is mounted on the mounting board in a face-up orientation, the surface on which the pair of electrodes are formed becomes the primary light extraction surface 11 of the light emitting element 10.

In this embodiment, the pair of electrodes of the light emitting element 10 is flip chip mounted on the conductive wiring patterns (anode 32, cathode 33, and intermediate electrode 34) of the mounting board 30 via a bonding material. In the light emitting element 10, the surface on which the electrodes are formed is referred to as the lower surface, and the opposing upper surface is referred to as the light extraction surface 11.

The light emitting device 1 according to this embodiment has a plurality of light emitting elements 10, and the plurality of light emitting elements 10 are arranged so as to be in a substantially rectangular shape as a whole in a plan view.

Light Transmissive Member

As shown in FIG. 1 to FIG. 4, the light transmissive member 2 is formed in a convex shape from the lower surface 7 to the upper surface 3. The lower surface 7 of the light transmissive member 2 is bonded to the upper surfaces, i.e., the light extraction surfaces 11, of the plurality of light emitting element 10. The light transmissive member 2 has an upper surface 3 and a lower surface 7 opposing to the upper surface 3, allowing the light emitted from the light emitting elements 10 to be incident on the lower surface 7 and be output from the upper surface 3 which has a smaller area than that of the lower surface 7. The light transmissive member 2 is formed as a single sheet and includes an upper surface 3, first lateral surfaces 4 contiguous with the upper surface 3, a second upper surface 5 contiguous with the first lateral surfaces 4, second lateral surfaces 6 contiguous with the second upper surface 5, and a lower surface 7 contiguous with the second lateral surfaces.

The lower surface 7 of the light transmissive member 2 is the surface on which the light from the plurality of light emitting elements 10 of the light emitting device 1 is incident. The lower surface 7 is formed to have a larger area than the sum of the upper surface areas of the light emitting elements 10 which are bonded to the lower surface 7. The lower surface 7 is formed to have a flat surface. The lower surface 7 of the light transmissive member 2 is formed to have a larger area than the light extraction surfaces 11 of the light emitting elements 10 so as to encompass all of the light extraction surfaces 11 of the light emitting elements 10. The lower surface 7 of the light transmissive member 2 formed larger than the sum of the upper surface areas of the light emitting elements 10 allows the light emitted from the light emitting elements 10 to be incident with little loss. The ratio of the area of the lower surface 7 to the sum of the upper surface areas of the light emitting elements 10 is in a range between 105% and 150%.

The lower surface 7 of the light transmissive member 2 is preferably large enough for the adhesive material 15 to spread over the lateral surfaces of the light emitting elements 10 to form fillets 16. In other words, the lower surface 7 of the light transmissive member 2 is preferably in a size so that the edges of the fillets 16 formed by the adhesive material 15 match the edges of the lower surface 7. The lower surface 7 of the light transmissive member 2 is large enough to cover all of the upper surfaces of the light emitting elements 10 even if a slight misalignment occurs when the light transmissive member 2 is bonded to the light emitting elements 10. Thus, the light transmissive member 2 is substantially free of luminance variation attributable to mounting deviation, thereby increasing the yield in the production process.

The lower surface 7 and the upper surface 3 of the light transmissive member 2 are formed flat and in parallel to each another. The second lateral surfaces 6 are formed continuously with the lower surface 7.

The upper surface 3 of the light transmissive member 2, serving as the emission surface of the light emitting device 1, outputs the light which has been incident on the lower surface 7. The upper surface 3 is formed smaller than the area of the lower surface 7. The light transmissive member 2 is disposed so that its upper surface 3 is exposed with less covered by the light reflective member 20. The upper surface 3 is formed to have a flat surface. In a plan view, the upper surface 3 and the lower surface 7 are formed to have similar shapes, and their centers of gravity overlap with one another. The first lateral surfaces 4 are formed to be contiguous with the upper surface 3.

The upper surface 3 of the light transmissive member 2 preferably has a smaller area than the sum of the upper surface areas of one or more light emitting elements of the light emitting device 1. The area of the upper surface 3 of the light transmissive member 2 is preferably 70% or less, more preferably 50% or less, of the area of the lower surface 7 of the light transmissive member 2. Reducing the area of the upper surface 3 in this way allows the light emitted from the light emitting elements 10 being incident on the lower surface 7 of the light transmissive member 2 to be output from the upper surface 3, i.e., the emission surface, having a smaller area. In other words, having a reduced light extraction surface area structured by the light transmissive member 2, the light emitting device 1 can extend the illumination distance at high luminance.

The first lateral surfaces 4 of the light transmissive member 2 are formed substantially perpendicular to the upper surface 3. Having been formed substantially perpendicular to the upper surface 3, the first lateral surfaces 4 can reduce the light reflective member 20 from creeping onto the upper surface 3 during the production of the light emitting device 1. The angle of the first lateral surfaces 4 that can reduce the creeping of the light reflective member 20, for example, is 90 degrees plus or minus 5 degrees relative to the upper surface 3, and this range herein is referred to as being substantially perpendicular. Forming the first lateral surfaces 4 substantially perpendicular to the upper surface 3 clearly defines the borders between the emission portion and the non-emission portion at the upper surface of the light emitting device 1 when the upper surface 3 of the light transmissive member 2 is the emission surface. The second upper surface 5 is formed to be contiguous with the first lateral surfaces 4.

The second upper surface 5 of the light transmissive member 2 is formed in accordance with the size of the lower surface 7. In this embodiment, the second upper surface 5 is formed substantially in parallel to the upper surface 3 and the lower surface 7. The second upper surface 5 is formed to have curved surface portions at the contact areas with the first lateral surfaces 4. The curved surface portions provided at the contact areas with the first lateral surfaces 4 can increase the mechanical strength at the contact areas, as well as reducing the attenuation of light occurring between the second upper surface 5 and the lower surface 7. The second lateral surfaces 6 are formed to be contiguous with the second upper surface 5.

The second lateral surfaces 6 of the light transmissive member 2 are formed substantially perpendicular to the lower surface 7. By forming the second lateral surfaces 6 substantially perpendicular to the lower surface 7, the adhesive material 15 is less likely to creep up the lateral surfaces when bonding the light transmissive member 2 and the light emitting elements 10 together during the production of the light emitting device 1. With reduction in creepage of the adhesive material 15, leakage of the light emitted from the light emitting elements 10 is reduced at the second lateral surfaces 6.

The light transmissive member 2 is formed of a material which transmits the light emitted from the light emitting elements 10 to be extracted. The upper surface 3 of the light transmissive member 2, which is exposed from the light reflective member 20, serves as the light extraction surface 11, i.e., the emission surface of the light emitting device 1.

The light transmissive member 2 can contain a light diffusing agent, and a phosphor which can convert the wavelength of at least a portion of the light emitted by the light emitting element 10. Examples of the light transmissive member 2 containing a phosphor include a sintered body of a phosphor, as well as resins, glass, and other inorganic materials, which contain phosphor powder, such as YAG glass. A sintered body of a phosphor may be formed with a phosphor by itself, or a combination of a phosphor and a sintering aid. In the case of sintering a mixture of a phosphor and a sintering aid, it is preferable to use an inorganic material as a sintering aid, such as silicon oxide, aluminum oxide, titanium oxide, or the like. This can reduce discoloration or deformation of the sintering aid caused by light or heat even in the case of a high optical output light emitting element 10.

With respect to the light transmissive member 2, the higher the transmittance, the more reflections result at the interface with the light reflective member 20 described later, which increases the luminance, and thus is preferable. In the case of a high optical output light emitting element 10, the light transmissive member 2 is more preferably formed only with an inorganic material.

The thickness of the light transmissive member 2, as in the dimension from the upper surface 3 to the lower surface 7, for example, is in a range between about 50 μm and about 30 μm.

In the thickness described above, the height of the second lateral surfaces 6 is preferably in a range between about 10% and about 50% of the height from the upper surface 3 to the lower surface 7. The greater the height of the second lateral surfaces 6, the smaller the amount of the light reflective member 20 disposed above the second upper surface 5 becomes, which might allow the light to leak via the light reflective member 20 in the periphery of the upper surface 3. As the height of the second lateral surface 6 is smaller, chipping or the like easily occurs, thus the light emitted from the light emitting element 10 is less likely to propagate.

The phosphors that can be contained in the light transmissive member 2 can suitably be selected from those used in the art. Examples of the phosphors excitable by a blue light emitting element or an ultraviolet light emitting element include cerium activated yttrium aluminum garnet-based phosphors (YAG:Ce); cerium activated lutetium aluminum garnet-based phosphors (LAG:Ce); nitrogen-containing calciumaluminosilicate phosphors activated with europium and/or chromium ($CaO-Al_2O_3-SiO_2$:Eu); europium activated silicate-based phosphors ($(Sr,Ba)_2SiO_4$:Eu); β-SiAlON phosphors; nitride-based phosphors such as CASN-based phosphors ($CaAlSiN_3$:Eu), and SCASN-based phosphors ($(Sr,Ca)AlSiN_3$:Eu); KSF-based phosphors ($K_2SiF_6$:Mn); sulfide-based phosphors; and quantum dot phosphors. Various colors of light emitting devices, such as a white light emitting device, can be produced by combining these phosphors with a blue or UV light emitting element. In the case of producing a white light emitting device 1, a type and a concentration of a phosphor contained in the light transmissive member 2 are adjusted to produce white light. The concentration of a phosphor contained in the light transmissive member 2, for example, is in a range between about 5 mass % and about 50 mass %.

Examples of light diffusing agents which can be contained in the light transmissive member 2 include titanium oxide, barium titanate, aluminum oxide, and silicon oxide.

Adhesive Material

The light emitting elements 10 and the light transmissive member 2 can be bonded using an adhesive material 15. The adhesive material 15 is disposed continuously from the upper surface to at least one portion of the lateral surfaces of the light emitting elements 10, and being interposed between the light reflective member 20 and the lateral surfaces of the light emitting elements 10. The upper surface of the adhesive material 15 interposed between the light reflective member 20 and the lateral surfaces of the light emitting elements 10 is disposed in contact with the lower surface 7 of the light transmissive member 2.

For the adhesive material 15, any known adhesives, such as epoxy and silicone, high refractive index organic adhesives, low melting point glass, or the like can be used. The adhesive material 15 is more preferably an inorganic adhesive. If the adhesive material 15 is made of an inorganic material, it would hardly be degraded by heat or light, and thus is particularly convenient when using a high luminance light emitting element 10.

The adhesive material 15 is preferably disposed on the upper surface and the upper areas of the lateral surfaces of the light emitting element 10. Being disposed on the upper areas of the lateral surfaces of the light emitting elements 10, the adhesive material 15 wets and spreads between the lower surface 7 of the light transmissive member 2 and the lateral surfaces of the light emitting elements 10, forming fillets 16 that continue to the edges of the lower surface 7 of the light transmissive member 2. The fillets 16 are formed to cover the four lateral surfaces of each light emitting element 10 which is substantially rectangular in a plan view. Having the fillets 16, the adhesive material 15 allows the light from the lateral surfaces of the light emitting elements 10 to also be incident on the light transmissive member 2, thereby increasing the light extraction efficiency. The fillets 16 are preferably formed to a position lower than half the height of the lateral surfaces of the light emitting elements 10. The "bonding" of the light transmissive member 2 and the light emitting elements 10 may alternatively be accomplished by a direct bonding method, such as compression, sintering, hydroxyl group bonding, surface activated bonding, atomic diffusion bonding, or the like.

Figure 4:
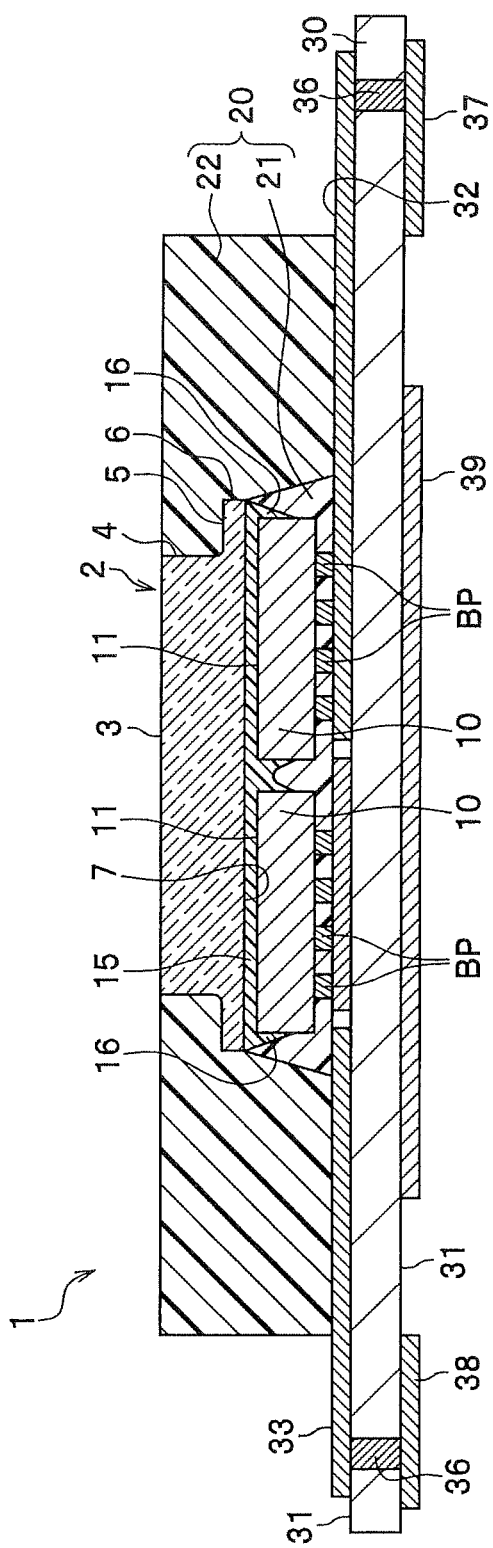
FIG. 4 is a schematic sectional view of the light emitting device along line A-A indicated in FIG. 2.

The light reflective member 20, as shown in FIG. 1, FIG. 2, and FIG. 4, reflects the light traveling towards areas other than the upper surface 3 of the light transmissive member 2 to allow the light to be output from the upper surface 3, while covering and protecting the lateral surfaces of the light emitting element 10 from external forces, dust, gas, or the like. The light reflective member 20 is disposed to cover the light transmissive member 2, light emitting element 10, and a portion of the upper surface of the mounting board 30, while exposing the upper surface 3 of the light transmissive member 2 which serves as the light-output surface (i.e., light extraction surface). Specifically, the light reflective member 20 is disposed to cover the first lateral surfaces 4, the second upper surface 5, and the second lateral surfaces 6 of the light transmissive member 2, the lateral surfaces of the fillets 16, and the lateral surfaces and the lower surface of the light emitting elements 10. The light extraction surfaces 11 of the light emitting elements 10 are not directly covered at least by the light reflective member 20 to allow the light to be incident on the light transmissive member 2. The light reflective member 20 is made of a material capable of reflecting the light from the light emitting elements 10, to reflect the light from the light emitting elements 10 at the interface between the light transmissive member 2 and the light reflective member 20 and allow the light to be incident on the light transmissive member 2. As such, the light emitted from the light emitting elements 10 is reflected by the light reflective member 20, passes through the light transmissive member 2, and is externally output from the upper surface 3 of the light transmissive member 2 which is the light-output surface of the light emitting device 1.

Here, the height of the upper surface of the light reflective member 20 is preferably the same as, or lower than, the height of the upper surface 3 of the light transmissive member 2. The light output from the upper surface 3 of the light transmissive member 2, which is the emission surface, tends to extend transversely as well. If the upper surface of the light reflective member 20 is higher than the upper surface 3 of the light transmissive member 2, the light output from the upper surface 3 of the light transmissive member 2 would hit and be reflected by the light reflective member 20 to cause variations in the luminous intensity distribution. Accordingly, the light reflective member 20 is disposed to cover the first lateral surfaces 4 of the light transmissive member 2 and to the height equivalent to or lower than the height of the upper surface 3 of the light transmissive member 2. This is preferable because the light emitted from the light emitting elements 10 can be efficiently extracted from the light emitting device 1.

The light reflective member 20 can be formed by adding a light reflecting substance to a base material made of a silicone resin, modified silicone resin, epoxy resin, modified epoxy resin, acrylic resin, or a hybrid resin containing at least one of these resins. For the light reflecting substance, titanium oxide, silicon oxide, zirconium oxide, potassium titanate, alumina, aluminum nitride, boron nitride, mullite, or the like, can be used. Optical reflectance and transmission of the light reflective member 20 vary depending on the concentration and density of the light reflecting substance contained therein. Accordingly, the concentration and the density can be suitably adjusted in accordance with the shape and the size of the light emitting device. Using a reflective material which also has heat dissipation properties for the light reflective material 20 can improve the heat dissipation properties in addition to the light reflectance properties. Examples of such materials include ceramics, more specifically, aluminum oxide, aluminum nitride, and boron nitride.

The light reflective member 20 may be equipped with two light reflective members 21 and 22 having different linear expansion coefficients. The light reflective member 21 having a lower linear expansion coefficient is disposed to the height to fill the space between the light emitting elements 10 and the mounting board 30, and cover the light emitting elements 10, and the fillets 16 formed on the lateral surfaces. The light reflective member 21 has a linear expansion coefficient lower than that of the light reflective member 22, serving as the underfill. Disposing the light reflective member 21 between the light emitting elements 10 and the mounting board 30, stress, which is caused at the bonding material disposed between the light emitting elements 10 and the mounting board 30 can be relieved. After disposing the light reflective member 21, the light reflective member 22 is filled to the height of the upper surface of the light transmissive member 2 to cover the first lateral surfaces 4, the second upper surface 5, the second lateral surfaces 6, and the light reflective member 21.

Mounting Board

The mounting board 30 mounts one or more light emitting elements 10, and electrically connects the light emitting device 1 to the outside.

Figure 5:
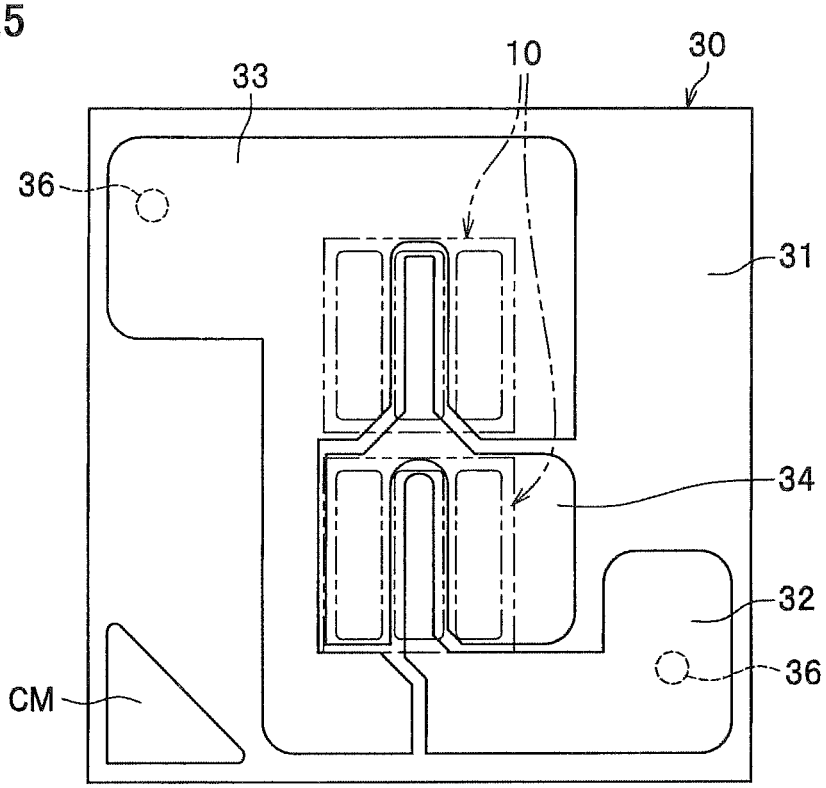
FIG. 5 is a schematic plan view of the mounting board of the light emitting device according to Embodiment 1.
Figure 6:
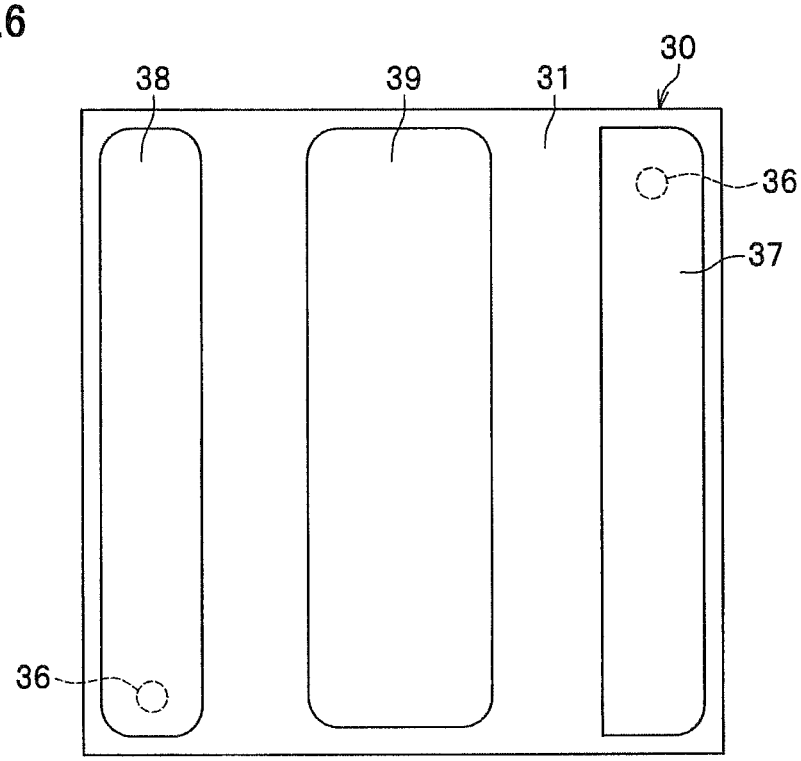
FIG. 6 is a schematic bottom view of the mounting board of the light emitting device according to Embodiment 1.

As shown in FIG. 4 to FIG. 6, the mounting board 30 is constructed with a plate-like support member 31, and conductive wiring patterns 32-34 and 36-38 disposed on the surfaces of, and on the inside of the support member 31. Specifically, the mounting board 30 has, as conductive wiring patterns, an anode 32, a cathode 33, and an intermediary electrode 34, on the upper surface of the mounting board where the light emitting element 10 is to be mounted. It has an external connection anode 37 connected to the anode 32 by way of a via 36, and an external connection cathode 38 connected to the cathode 33 by way of a via 36, on the lower surface of the mounting board. The anode 32 and the cathode 33 on the upper surface of the mounting board each extends from the part connected to the light emitting elements 10 towards the respective edges of the mounting board, a portion of each is exposed from the light reflective member 20. The portions of the anode 32 and cathode 33 on the upper surface of the mounting board which are exposed from the light reflective member 20 can be used as the external connection electrodes of the light emitting device. In other words, the light emitting device 1 has a pair of electrode patterns for external connection on both the upper surface and the lower surface of the device. When mounting the light emitting device 1 on a secondary mounting board, the power supply for the light emitting device 1 can be connected to either the upper surface or the lower surface of the light emitting device 1, or connected in such a way to interpose the upper and lower surfaces.

The mounting board 30 further includes a heat dissipation terminal 39 which is electrically independent from the light emitting elements 10. The structure of the mounting board 30, including the shapes and sizes of the electrodes, are set in accordance with the structure of the electrodes of the light emitting elements 10. The mounting board discussed here is structured in correspondence with the electrodes disposed on the light emitting elements 10, for example, in three locations (e.g., n electrode, p electrode, and n electrode). The heat dissipation terminal 39 is formed to have an area larger than the sum of the upper surface areas of all light emitting elements 10 included in the light emitting device 1, and disposed to overlap with the areas directly below the light emitting elements 10. Disposing such a heat dissipation terminal 39 in this way easily allows the heat generated by the operation of the light emitting elements 10 to be output. The mounting board 30 is provided with a cathode mark CM on the upper surface thereof to indicate the polarity of the electrode.

The support member 31 is preferably formed with an insulating material, and a material which less likely to transmit the light emitted from the light emitting element 10 or light from the outside. Moreover, it is preferable to use a material which has strength to some degree. Specific examples include ceramics, such as alumina, aluminum nitride, and mullite; and resins, such as phenol resins, epoxy resins, polyimide resins, BT (bismaleimide triazine) resins, and polyphthalamide (PPA). The support member 31 may have cavities. In this way, the light reflective member 20 can be easily formed by dripping followed by curing.

The conductive wiring patterns 32-34 and 36-38, and the heat dissipation terminal 39 can be formed on the surfaces or the inside of the support member 31 by using, for example, metals such as Cu, Ag, Au, Al, Pt, Ti, W, Pd, Fe, Ni, or alloys containing these. Such conductive wiring patterns can be formed by electroplating, electroless plating, vapor deposition, sputtering, or the like.

Figure 7:
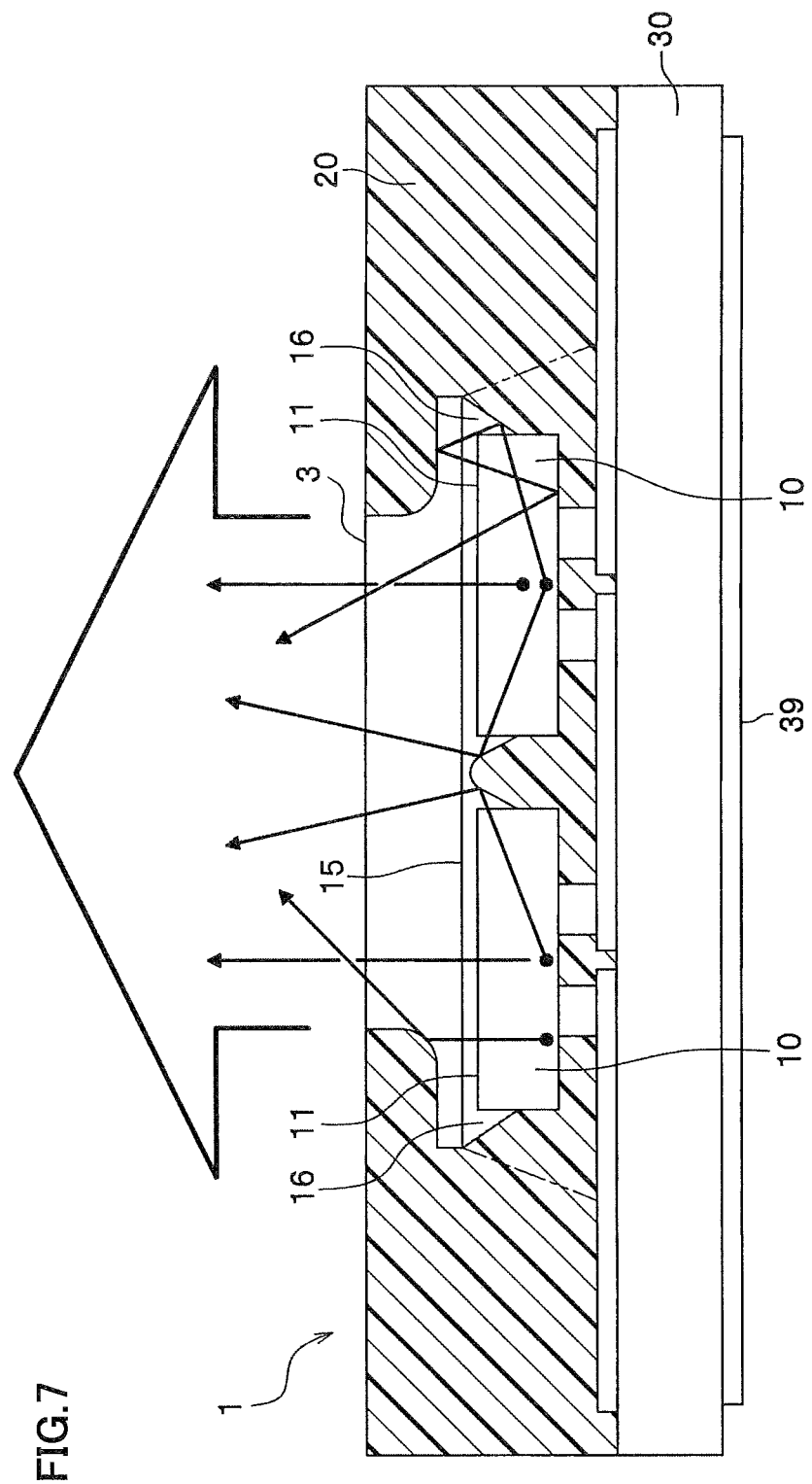
FIG. 7 is an explanatory diagram schematically illustrating the light emitted by the light emitting device according to Embodiment 1.

The light emitting device 1 structured as above can output the light emitted by the light emitting elements 10 farther in distance when used, for example, as the headlights of motorcycles, vehicles such as automobiles, and as lighting of transportation equipment, such as ships and aircraft. In the light emitting device 1, as shown in FIG. 7, one portion of the light emitted by one or more light emitting elements 10 travels directly towards the upper surface 3 without being reflected by the light reflective member 20, while the other portion of the light is reflected by the light reflective member 20 before being output from the upper surface 3. In the light-emitting device 1, moreover, since the lower surface 7 of the light transmissive member 2 has a larger area than the sum of all the upper surface areas of the light-emitting elements 10, the light emitted by the light-emitting elements 10 can be received with little loss. In the light-emitting device 1, the light reflected by the light reflective member 20 travels from the light-emitting elements 10 to be output from the upper surface 3 with little loss, together with the light that is output directly from the upper surface 3 of the light transmissive member 2. Since the area of the upper surface 3 of the light transmissive member 2 is smaller than the sum of the upper surface areas of the light-emitting elements 10, and smaller than the area of the lower surface 7 of the light transmissive member, the light emitted from the light-emitting elements 10 is concentrated at the upper surface 3. This makes the light-emitting device 1 suitable for use as high beams for headlights capable of outputting high luminance light over a great distance. FIG. 7 schematically shows the representative travelling directions of light using arrows.

Since the contact area between the light transmissive member 2 and the light reflective member 20 is of a large area in the light-emitting device 1, the heat dissipation properties of the light transmissive member 2 can be improved. In the light-emitting device 1, moreover, the second upper surface 5 and the second lateral surfaces 6 of the light transmissive member are securely locked by the light reflective member 20. Thus, it is unlikely for the light transmissive member 2 to be separated. Accordingly, in the case where the light transmissive member 2 of the light emitting device 1 contains a phosphor, the physical orientation of the light transmissive member 2 is maintained in the initially set condition, i.e., the positional relationship between the light emitting elements 10 and the light transmissive member 2 remains substantially the same. Thus, emission color non-uniformity is less likely to occur in the light emitting device 1.

Method for Producing Light Emitting Device

The method for producing the light emitting device will be explained next with reference primarily to FIG. 8A to FIG. 8F.

Mounting Board Providing Step

Figure 8A:
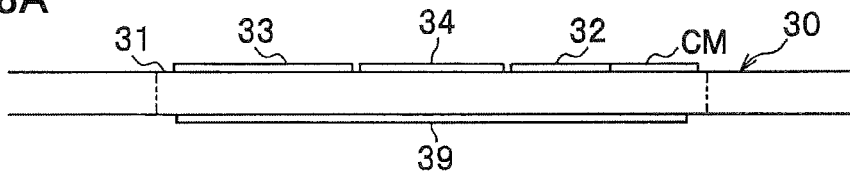
FIG. 8A is an explanatory diagram schematically showing the mounting board in the production method for the light emitting device according to Embodiment 1.

First, as shown in FIG. 8A, FIG. 5, and FIG. 6, a mounting board 30 is provided. The mounting board 30 includes a support member 31 which is substantially rectangular in a plan view, conductive wiring patterns 32-34 and 36-38, and a heat dissipation terminal 39. On the upper surface of the support member 31, an anode 32, a cathode 33, and an intermediate electrode 34 are formed as the conductive wiring patterns for mounting the light-emitting elements 10. On the lower surface of the support member 31, an external connection anode 37 and an external connection cathode 38 are formed as the conductive wiring patterns. The heat dissipation terminal 39 is formed between the external connection anode 37 and the external connection cathode 38. In this embodiment, the mounting board 30 is provided with a cathode mark CM along a corner portion of the upper surface of the mounting board by using the same material as that for the anode 32 and the like.

Light-Emitting Element Mounting Step

Figure 8B:
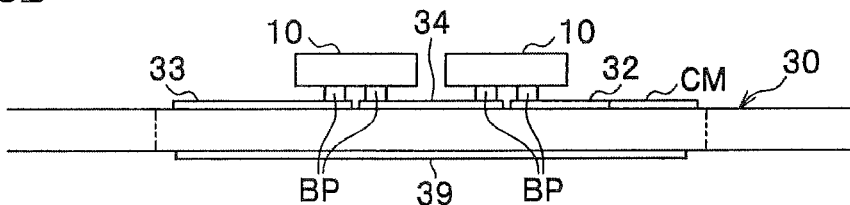
FIG. 8B is an explanatory diagram schematically showing the state in which light emitting elements are mounted on the mounting board in the production method for the light emitting device according to Embodiment 1.

As shown in FIG. 8B, one or more light emitting elements 10 are mounted on the mounting board 30. Here, the two light emitting elements 10 are mounted on the mounting board 30 via connecting members, such as bumps BP. The two light emitting elements 10 are arranged so that they are rectangular in shape as a whole in a plan view. The two light emitting elements 10 are preferably spaced apart, for example, to allow the later-described fillets 16 of the adhesive material 15 to be continuously formed between the light emitting elements 10. Specifically, in the case where the light emitting device 1 includes two or more light emitting elements 10, the spacing between the adjacent light emitting elements 10 is preferably twice the height of a light emitting element 10 at most.

Adhesive Supplying Step

Figure 8C:
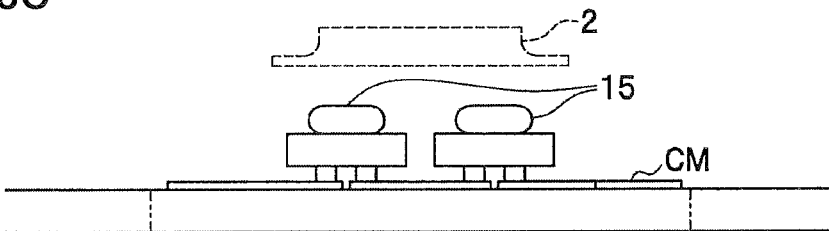
FIG. 8C is an explanatory diagram schematically showing the state in which an adhesive is applied on the light emitting elements in the production method for the light emitting device according to Embodiment 1.

As shown in FIG. 8C, the adhesive material 15 is dripped on the upper surfaces of the light emitting elements 10. The dripped adhesive material 15 is pressed down by the light transmissive member 2, wetting and spreading over the lateral surfaces of the light emitting elements 10 to form fillets 16. An amount and a viscosity of the adhesive material 15 is suitably adjusted so that fillets are formed on the lateral surfaces of the light emitting elements 10 without wetting and spreading onto the mounting board 30.

Light Transmissive Member Bonding Step

Figure 8D:
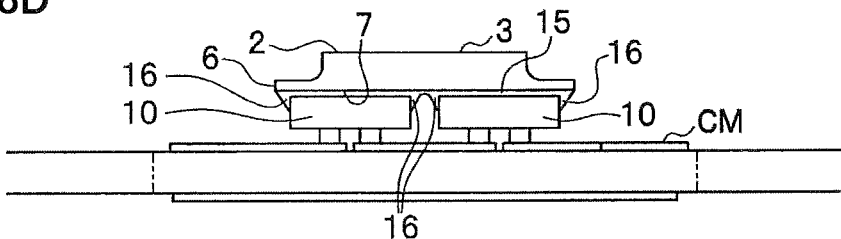
FIG. 8D is an explanatory diagram schematically showing the state in which a light transmissive member is bonded to the light emitting elements via the adhesive in the production method for the light emitting device according to Embodiment 1.

As shown in FIG. 8D, the lower surface of the light transmissive member 2 is bonded onto the light emitting elements 10 via the adhesive material 15 disposed on the upper surfaces of the light emitting elements 10. The light transmissive member 2, when formed with, for example, an inorganic material is less likely to be degraded by light or heat, thereby being able to produce a highly reliable light emitting device 1. The light transmissive member 2 is formed so that its lower surface 7 is larger in area than the sum of the upper surface areas of the light emitting elements 10, and is preferably disposed so that the distances from the lateral surfaces of the light emitting elements 10 to the outer edge of the lower surface 7 of the light transmissive member 2 are equal. The center of gravity of the light transmissive member 2 on the upper surface 3 side preferably overlaps with the center of gravity of the plural light emitting elements 10 as a whole, which are arranged in a rectangular shape as a whole. The light transmissive member 2 bonded to the light emitting elements 10 has a larger area lower surface 7 than the sum of the upper surface areas of the light emitting elements 10. Accordingly, the fillets 16 made of the adhesive material 15 are formed across the width of the light transmissive member 2 projecting sideways from the lateral surfaces of the light emitting elements 10. The fillets 16 are also formed on the lateral surfaces of the light emitting elements 10 that face to each other, i.e., on all four lateral surfaces of each light emitting element 10.

Light Reflective Member Supplying Step

Figure 8E:
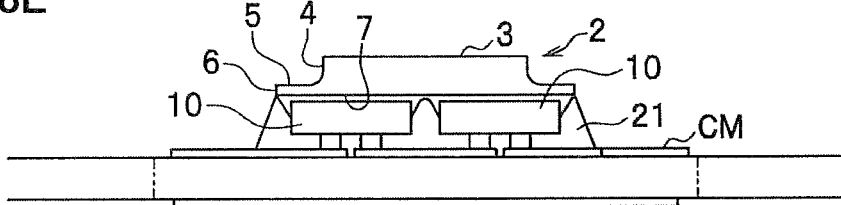
FIG. 8E is an explanatory diagram schematically showing the state in which a light reflective member is disposed as the underfill in the peripheries of the light emitting elements in the production method for the light emitting device according to Embodiment 1.
Figure 8F:
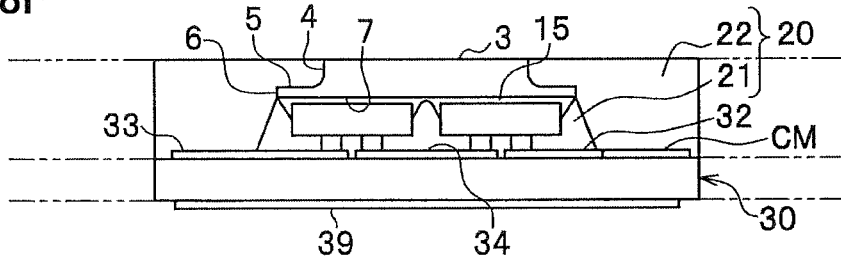
FIG. 8F is an explanatory diagram schematically showing the state in which a light reflective member is disposed on the surface of the light emitting elements and the light transmissive member except for their upper surfaces in the production method for the light emitting device according to Embodiment 1.

As shown in FIG. 8E and FIG. 8F, a light reflective member 20 is disposed to cover the light emitting elements 10, light transmissive member 2, and the mounting board 30. The light emitting device 1 according to this embodiment includes two types of light reflective members 21 and 22 for the light reflective member 20.

Supplying Step 1

First, the light reflective member 21 is supplied between the light emitting elements 10 and the mounting board 30, and to a height to cover the fillets 16 on the lateral surfaces of the light emitting elements 10. Since the light reflective member 21 is disposed as the underfill between the light emitting elements 10 and the mounting board 30, it is preferable to use a material having a lower coefficient of linear expansion than that of the light reflective member 22. This can reduce the stress at the connection portions between the light emitting elements 10 and the mounting board 30.

Supplying Step 2

Then, the light reflective member 22 is supplied to cover the first lateral surfaces 4, the second upper surface 5 and the second lateral surfaces 6 of the light transmissive member 2. At this point, the light reflective member 22 is preferably supplied by dripping onto the upper surface of the mounting board 30 which is distant from the light transmissive member 2 so that the upper surface 3 of the light transmissive member 2 will be exposed from the light reflective member 22. The light reflective member 22 covers the surface of the light transmissive member 21.

For the light reflective members 21 and 22, for example, a silicone resin, which contains titanium oxide, i.e., the so-called white resin, is used here.

Separation Step

After forming the light reflective member 20, the mounting board 30 is cut to separate into individual units of a plurality of light emitting devices 1. The light emitting device 1 includes one or more light emitting elements 10, i.e., it can have three, four, five or more, or one. The light emitting device 1 produced by the steps described above allows the light emitted from one or more light emitting elements 10 to be incident on the lower surface 7 of the light transmissive member 2 having a larger area than the sum of the upper surface areas of the light emitting elements 10, with little light loss, and can output high luminance light from the upper surface 3 having a smaller area than the lower surface 7 of the light transmissive member 2.

Next, Embodiments 2 to 4 will be explained with reference to FIG. 9A to FIG. 9C. Embodiments 2 to 4 have the same constituent features as those of Embodiment 1 except for the shape of the light transmissive member, and thus the explanation is appropriately omitted.

Embodiment 2

Figure 9A:
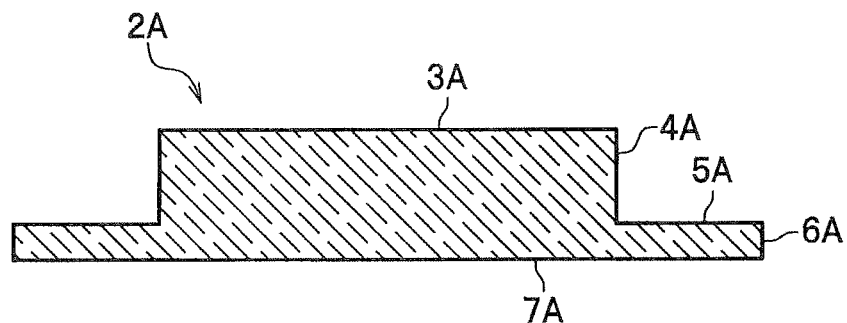
FIG. 9A is a sectional view of the light transmissive member used in the light emitting element according to Embodiment 2.

As shown in FIG. 9A, the light transmissive member 2A is formed into a shape projecting from the lower surface 7A to the upper surface 3A. The light transmissive member 2A has an upper surface 3A, first lateral surfaces 4A, a second upper surface 5A, second lateral surfaces 6A, and a lower surface 7A. The light transmissive member 2A is different from the light transmissive member 2 according to Embodiment 1 such that the contact areas between the first lateral surfaces 4A and the second upper surface 5A are formed at right angles. Even when light transmissive member 2A is formed so that the first lateral surfaces 4A form right angles with the upper surface 5A, the light emitting device can be as effective as Embodiment 1.

Embodiment 3

Figure 9B:
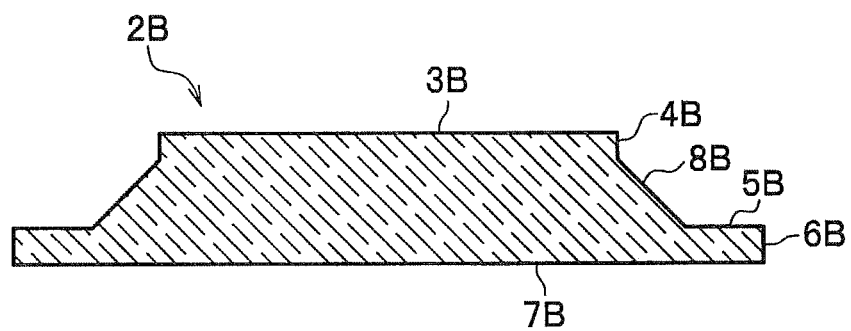
FIG. 9B is a sectional view of the light transmissive member used in the light emitting element according to Embodiment 3.

As shown in FIG. 9B, the light transmissive member 2B is formed into a shape projecting from the lower surface 7B to the upper surface 3B. The light transmissive member 2B includes: a flat upper surface 3B without inclination; first lateral surfaces 4B contiguous with, and substantially perpendicular to, the upper surface 3B; oblique surfaces 8B contiguous with the first lateral surfaces 4B; a second upper surface 5B contiguous with the oblique surfaces 8B and substantially parallel to the upper surface 3A; second lateral surfaces 6B contiguous with, and substantially perpendicular to, the second upper surface 5B; and a lower surface 7B contiguous with the second lateral surfaces 6B and substantially parallel to the upper surface 3B. The light transmissive member 2B is different from the light transmissive member 2 according to Embodiment 1 such that it has the oblique surfaces 8B between the first lateral surfaces 4B and the second upper surface 5B. The oblique surfaces 8B are formed, for example, so as to form an angle in a range between 10 and 60 degrees with respect to the second upper surface 5B. Having the oblique surfaces 8B, the light transmissive member 2B can efficiently send the light from the light emitting elements 10 towards the upper surface 3B by reducing the number of reflections, producing a high luminance light emitting device.

Embodiment 4

Figure 9C:
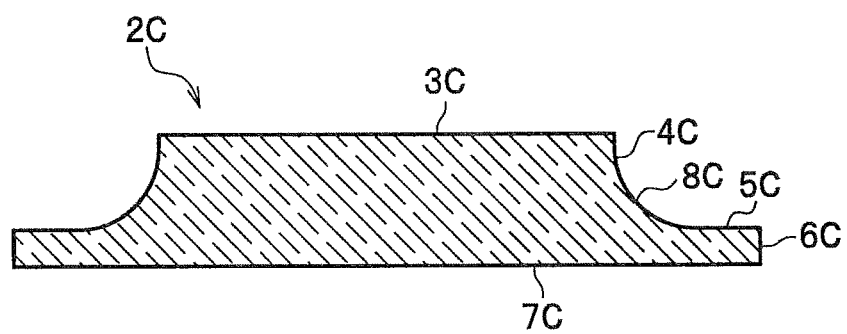
FIG. 9C is a sectional view of the light transmissive member used in the light emitting element according to Embodiment 4.

As shown in FIG. 9C, the light transmissive member 2C is formed into a shape projecting from the lower surface 7C to the upper surface 3C. The light transmissive member 2C includes: a flat and horizontal upper surface 3C; first lateral surfaces 4C contiguous with, and substantially perpendicular to, the upper surface 3C; curved surfaces 8C which are concave and contiguous with the first lateral surfaces 4C; a second upper surface 5C contiguous with the curved surfaces 8C and substantially parallel to the upper surface 3C; second lateral surfaces 6C contiguous with, and substantially perpendicular to, the second upper surface 5C; and a lower surface 7C contiguous with the second lateral surfaces 6C and substantially parallel to the upper surface 3C. The light transmissive member 2C is different from the light transmissive member 2 according to Embodiment 1 such that it has the curved surfaces 8C over a wide range between the first lateral surfaces 4C and the second upper surface 5C. The curved surfaces 8C has a shape of, for example, the first lateral surfaces 4C continued to the second upper surface 5C contiguous, and inwardly convex arcs. Having the curved surfaces 8C, the light transmissive member 2C can efficiently send the light from the light emitting elements 10 towards the upper surface 3B by reducing the instances of reflection, producing a high luminance light emitting device. The curved surfaces 8C can reduce the stress concentrations, thereby improving the structural strength of the light transmissive member 2C.

Embodiment 5

Subsequently, Embodiment 5 will be explained with reference to FIG. 10 and FIG. 11. Except for the features described below, Embodiment 5 is substantially the same as Embodiment 1, the explanation for which is omitted.

Figure 10:
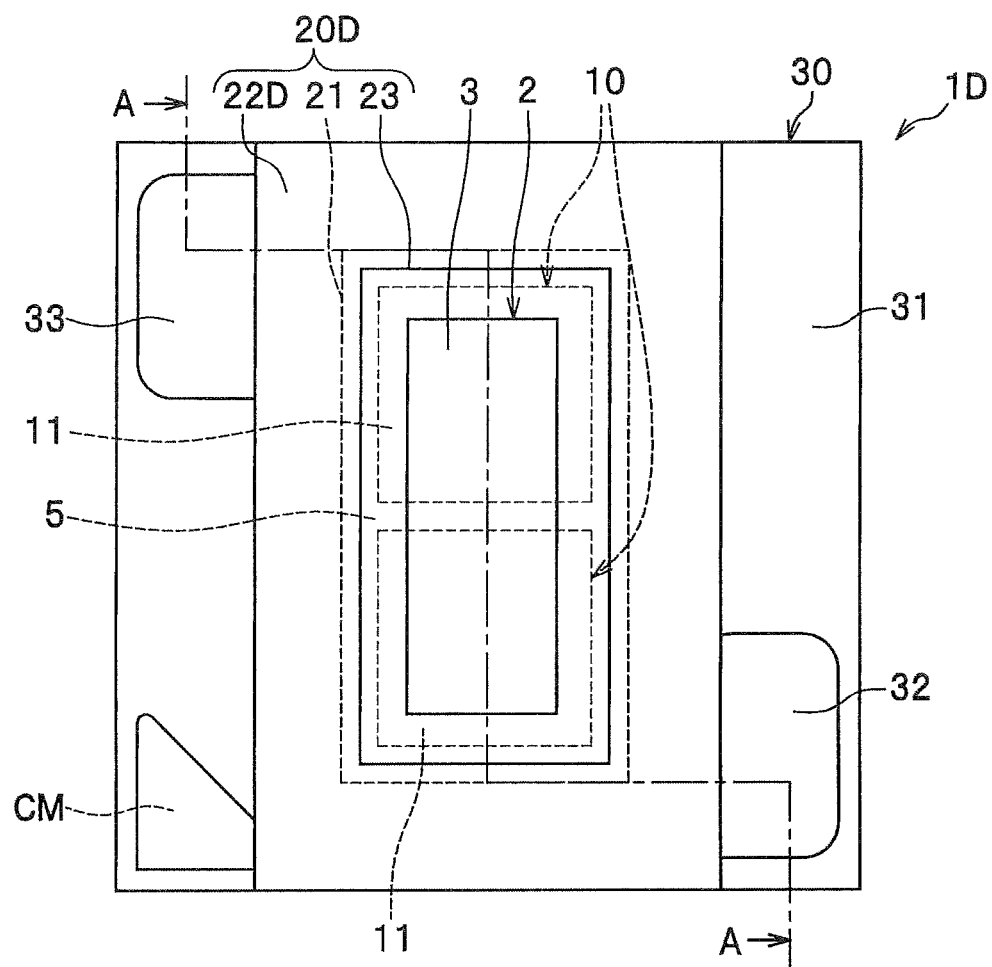
FIG. 10 is a schematic plan view of the light emitting device according to Embodiment 5.
Figure 11:
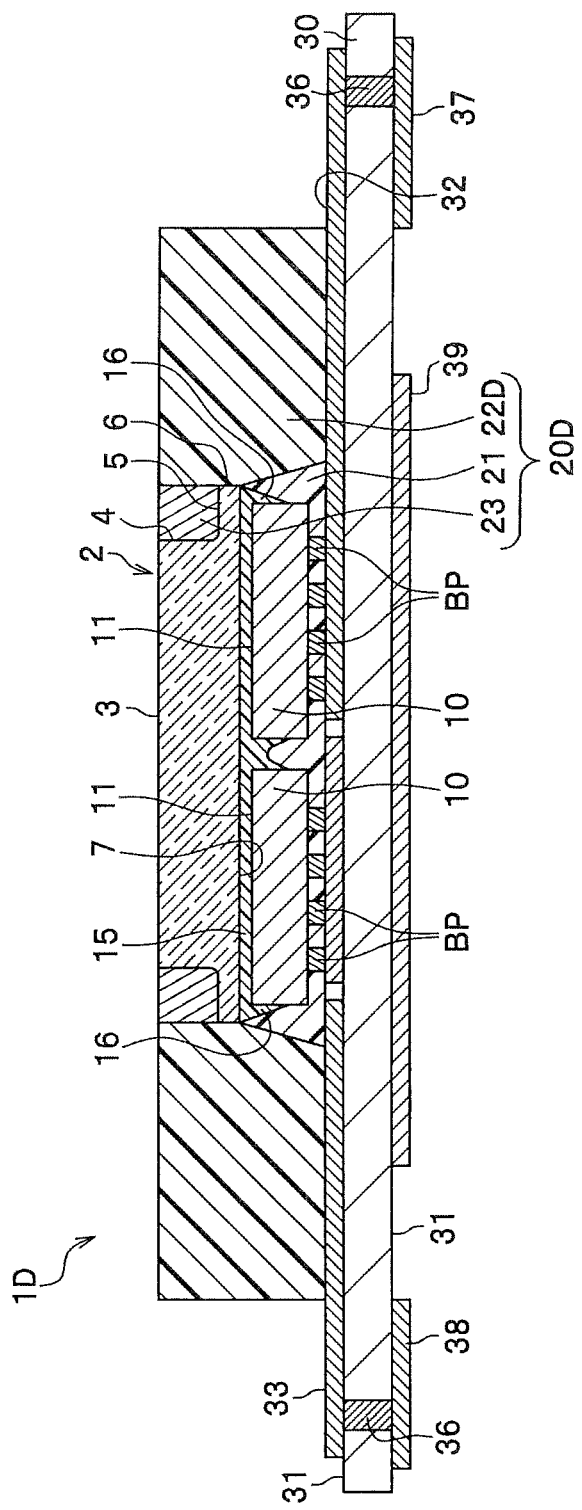
FIG. 11 is a schematic sectional view of the light emitting device according to Embodiment 5 along line A-A indicated in FIG. 10.

As shown in FIG. 10 and FIG. 11, the light emitting device 1D has a light reflective member 20D which include a resin component 22D (containing light reflective substance) and a ceramic component 23 (having light reflective property). The ceramic component 23 is disposed in the periphery of the upper surface 3 of the light transmissive member 2 in a plan view when the light reflective member 20D and the light transmissive member 2 are viewed from the top. When a material such as resin which contains an organic material is disposed in the area that is in contact with the light transmissive member 2, cracks might occur in areas of the light reflective member 20D that is in contact with the light transmissive member 2 due to the highly intense light. If cracks occur in the periphery of the upper surface 3 of the light transmissive member 2, which is the emission surface of the light emitting device 1, in particular, the light would leak from the cracks, thus reducing the luminance of the light emitting device 1. Accordingly, in this embodiment, a highly light resistant ceramic component 23 is provided in the periphery of the emission surface of the light emitting device 1D so as to be adjacent to the emission surface, i.e., the upper surface 3, to reduce the formation of cracks at the periphery of the light transmissive member 2 to thereby provide a high luminance light emitting device 1D. The ceramic component 23 is a material having good heat dissipation properties as compared to resins, and thus can enhance the dissipation of the heat from the light transmissive member 2.

As shown in FIG. 11, the first lateral surfaces 4 and the second upper surface 5 are covered by the ceramic component 23, while the second lateral surfaces 6 are covered by the resin containing a light reflecting substance 22D. As shown in FIG. 10, in a plan view, the resin containing a light reflecting substance 22D is disposed to surround the ceramic component 23. The structure of the light reflective member 20D includes the ceramic component 23, separately from the resin containing a light reflecting substance 22D, and the ceramic component 23 is disposed in the periphery of the upper surface of the light transmissive member 2 so as be adjacent thereto.

Embodiment 6

Figure 12:
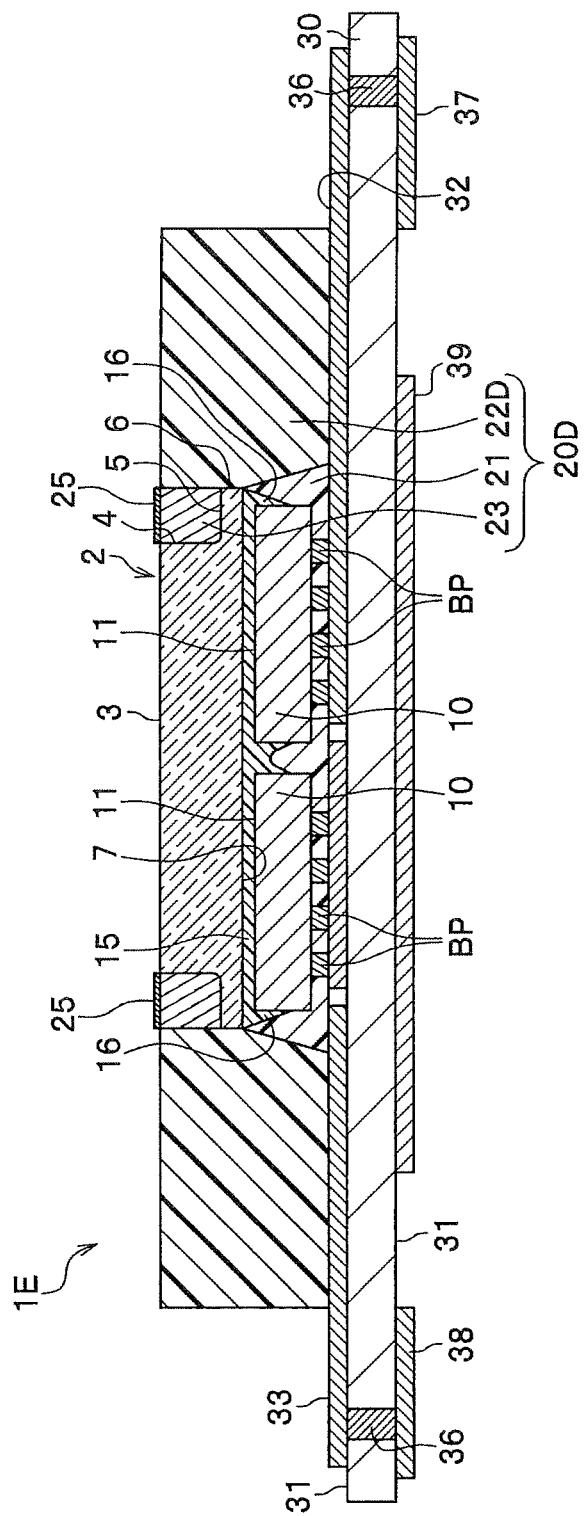
FIG. 12 is a schematic sectional view of the light emitting device according to Embodiment 6.

Embodiment 6 will be explained next with reference to FIG. 12. Except for the features described below, Embodiment 6 is the same as Embodiment 5, the explanation for which is omitted. In the light emitting device 1E, a reflective film 25 is disposed in the periphery of the upper surface 3 of the light transmissive member 2 in a plan view. Specifically, as shown in FIG. 12, the reflective film 25 is disposed on the upper surface of the ceramic component 23 having reflectance. Even if a portion of the light passes through the ceramic component 23, the light passing through the ceramic component 23 can be reflected by the reflective film 25. This can lessen the reduction of the luminance of the light emitting device 1. For the reflective film 25, a metal can be used, for example, titanium or nickel. By disposing the reflective film 25 on the upper surface of the ceramic component 23, the device having good heat dissipation properties can be achieved while maintaining high luminance.

Embodiment 7

Figure 13:
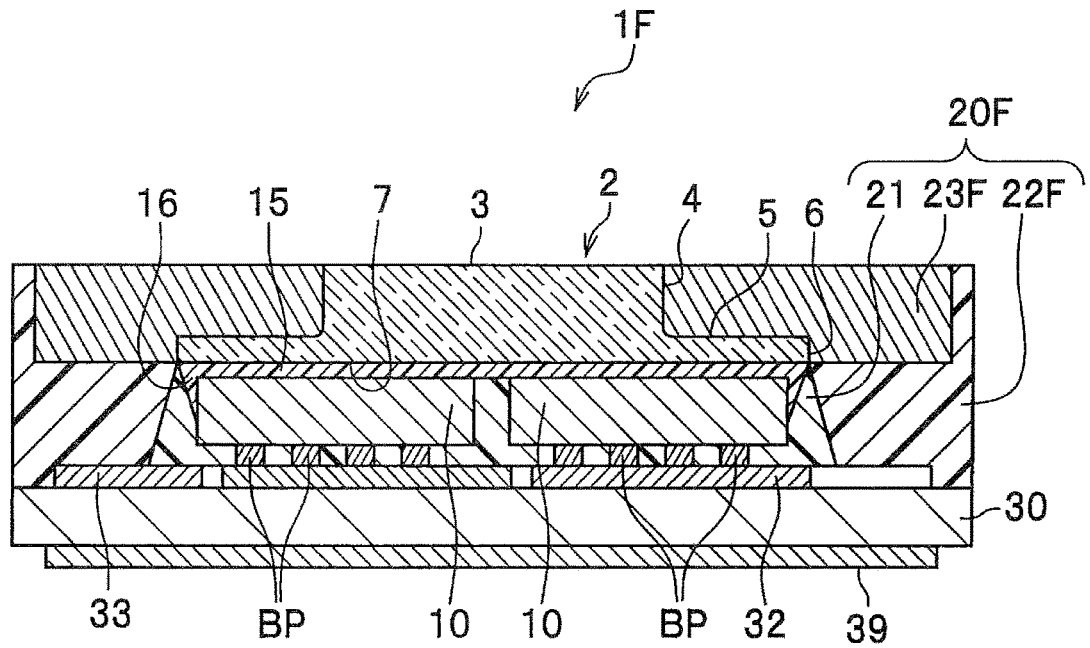
FIG. 13 is a schematic sectional view of the light emitting device according to Embodiment 7 cut at a center in a short-side direction of the light reflective member.

Embodiment 7 will be explained next with reference to FIG. 13. Except for the features described below, Embodiment 7 is substantially the same as Embodiment 5, the explanation for which is omitted. FIG. 13 is a schematic sectional view of the rectangular light reflective member 20F, which is cut longitudinally at the transverse center thereof. Embodiment 7 is structured with the ceramic component 23F explained in Embodiment 5 which is disposed in a wider range so as to cover the first lateral surfaces 4, the second upper surface 5, and the second lateral surfaces 6 of the light transmissive member 2. In this case, the ceramic component 23F is extended out from the outer perimeter of the second upper surface 5 of the light transmissive member 2 in a plan view. It suffices to dispose the resin containing a light reflecting substance 22F or the light reflective member 21 at least at the lateral surfaces of the fillets 16, and the lateral surfaces and lower surface of the light emitting elements 10. Here, the resin containing a light reflecting substance 22 is disposed to cover the lateral surfaces of the ceramic component 23F. By expanding the range where the ceramic component 23F is disposed, the heat dissipation of the light emitting device 1F can be further improved for.

Embodiment 8

Figure 14:
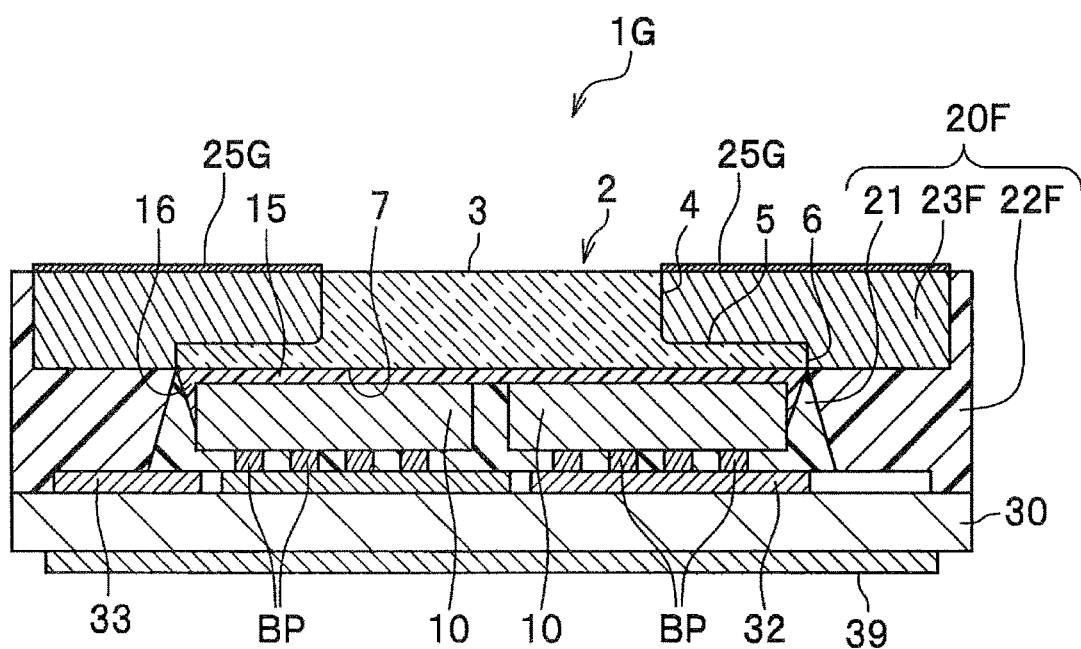
FIG. 14 is a schematic sectional view of the light emitting device according to Embodiment 8 cut at the transverse center of the light reflective member.

Embodiment 8 will be explained next with reference to FIG. 14. Except for the features described below, Embodiment 8 is the same as Embodiment 7, for which the explanation is omitted. In Embodiment 8, a reflective film 25G is added to Embodiment 7 in a similar manner to that provided in Embodiment 6. As shown in FIG. 14, in the light emitting device 1G, the ceramic component 23F is extended out from the outer perimeter of the second upper surface 5 of the light transmissive member 2 in a plan view, and the reflective film 25G is formed on the upper surface of the ceramic component 23F. By forming the reflective film 25G on the ceramic component 23F, the reduction of the luminance can be lessened. The reflective film 25G is configured in the same way as explained in Embodiment 6.

In Embodiment 5 and Embodiment 7, the ceramic component 23 and 23F, respectively, are preformed to fit the shapes of the light transmissive member 2. The reflective film 25 or 25G, as in the case of Embodiment 6 or 8, is formed by sputtering or the like after placing a mask on the upper surface of the light transmissive member 2.

Figure 15:
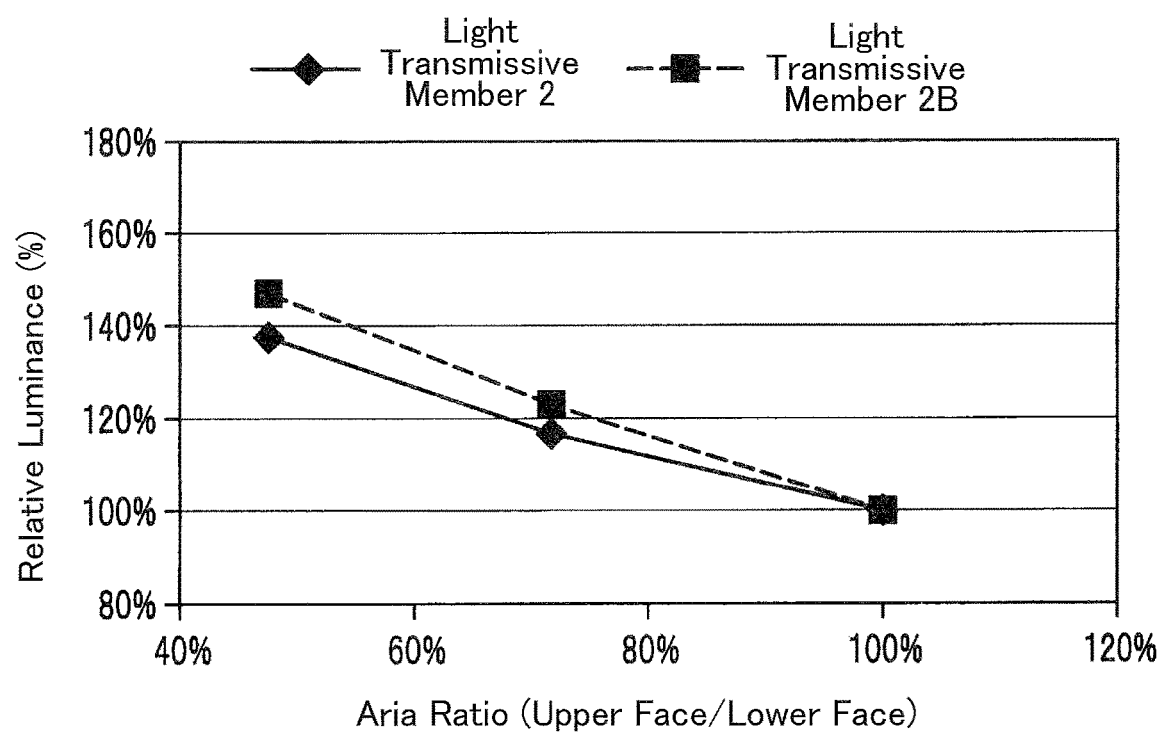
FIG. 15 is a graph showing the relationship between the relative luminance and the area ratio of the upper surface to the lower surface of the light transmissive member.

FIG. 15 shows the results of the measurement comparing the luminance of the light emitting devices 1 having the light transmissive member 2 of Embodiment 1 and those having the light transmissive member 2B of Embodiment 3 using various area ratios of the upper surface to the lower surface.

FIG. 15 reveals that the luminance of the light emitting devices using the light transmissive member 2 or 2B having a smaller area upper surface than the lower surface is improved as compared to the light emitting devices using the light transmissive members having the areal ratio of 100%, i.e., the upper surface area is equal to the lower surface area.

Specifically, assuming that the luminance of the light emitting devices employing either light transmissive member in which the upper surface area is equal to that of the lower area is 100%, the luminance of the light emitting devices employing the light transmissive member 2 or 2B in which the upper surface area is about 70% of the lower surface area improved to about 120%, and the luminance of the light emitting devices employing the light transmissive member 2 or 2B in which the upper surface area is about 50% of the lower surface area improved to about 140%.

In the light transmissive members 2, 2A-2C for the light emitting device explained above, the upper surface 3, 3A, 3B or 3C, and the lower surface 7, 7A, 7B or 7C can be provided with irregularity, or the upper surface 3, 3A, 3B, or 3C can have a curved surface so as to have a lens function. The irregularity provided on the lower surface 7, 7A, 7B or 7C of the light transmissive member 2, 2A, 2B or 2C can scatter the incident light from the light emitting elements 10, which easily reduces luminance non-uniformity and color non-uniformity. This is particularly preferable when plural light emitting elements 10 are bonded to a single light transmissive member 2, 2A, 2B or 2C, as the irregularity reduce the effect of the layout of the light emitting elements 10 as well as the effect of the light distribution, luminance non-uniformity, and color non-uniformity due to the effect of the layout of the light emitting elements 10.

The adhesive material 15, which bonds the light transmissive member 2, 2A, 2B or 2C and the light emitting elements 10, may contain a phosphor, a light diffusing agent, or the like.

In Embodiment 1, the structure in which two light emitting elements 10 are mounted on the mounting board 30 was explained, but the number of the light emitting elements 10 can be appropriately determined. The number of the light emitting elements can be suitably changed in accordance with a given size of the light emitting device 1 or the luminance required. In the case of mounting plural light emitting elements 10, a single light transmissive member 2, 2A, 2B or 2C can be bonded to each of the light emitting elements, or to a plural number of light emitting elements 10.

In the light emitting device 1 according to the present disclosure, a protective element, such as a Zener diode, may be provided on the mounting board 30. Embedding such a protective element in the light reflective member 20 can prevent the light extraction from being reduced by the absorption or blocking of light by the protective element. The structures shown in FIG. 9A to FIG. 9C exemplified in the light emitting device 1 according to the present disclosure is similarly applicable to the light emitting devices 1D to 1G.

The light emitting device according to the present disclosure can be used as light sources of the headlights for motorcycles, automobiles, vehicles, and of lighting of transportation equipment such as ships, aircraft, and the like, in addition to various light sources, including lighting fixtures, spotlights, displays, and automotive parts.

The light emitting device according to the embodiments have been described in detailed description of embodiments, but the spirits of the present invention are not limited to these descriptions, and should be widely interpreted from the description in the claims.

The light emitting devices according to the embodiments of the present disclosure can be of higher luminance.

Obviously, numerous modifications and variations of the present invention are possible in light of the above teachings. It is therefore to be understood that within the scope of the appended claims, the invention may be practiced otherwise than as specifically described herein.

What is claimed is:

1. A light emitting device comprising:
a mounting board;
one or more light emitting elements mounted on the mounting board, the one or more light emitting elements each including an upper surface as a light extraction surface;
a light transmissive member bonded to the upper surface of each of the one or more light emitting elements, the light transmissive member having an upper surface and a lower surface and a lateral surface, and allowing light from the one or more light emitting elements to be incident on the lower surface of the light transmissive member and to be output from the upper surface of the light transmissive member; and
a light reflective member covering surfaces of the light transmissive member and lateral surfaces of the one or more light emitting elements so as to expose the upper surface of the light transmissive member, wherein at least a first portion of the mounting board is exposed from the light reflective member in a plan view, wherein, in the plan view, the light transmissive member further has a second upper surface surrounding the upper surface of the light transmissive member, and the lower surface is opposite the upper surface of the light transmissive member and the second upper surface, wherein, in the plan view, the lower surface of the light transmissive member encompasses the one or more light emitting elements, and the second upper surface of the light transmissive member overlaps the upper surface of each of the one or more light emitting elements, wherein the lateral surface of the light transmissive member has a curved surface, and wherein the second upper surface of the light transmissive member has a portion parallel to an upper surface of the mounting board without an intervening light emitting element of the one or more light emitting elements in the plan view.

2. The light emitting device according to claim 1, wherein at least one lateral surface of the mounting board is positioned flush with a lateral surface of the light reflective member in the plan view.

3. The light emitting device according to claim 1, wherein the first portion of the mounting board is exposed from the light reflective member in the plan view on a first side of the light reflective member, and wherein a second portion of the mounting board is exposed from the light reflective member in the plan view on a second side of the light reflective member.

4. The light emitting device according to claim 1, wherein a number of the one or more light emitting elements is more than one, wherein the light emitting elements and the light transmissive member are bonded using an adhesive material, wherein the adhesive material is disposed from the upper surfaces of the light emitting elements continuously to at least one portion of the lateral surfaces of the light emitting elements and interposed between the light reflective member and the lateral surfaces of the light emitting elements, wherein an upper surface of the adhesive material interposed between the light reflective member and the lateral surfaces of the light emitting elements is in contact with the lower surface of the light transmissive member, wherein the adhesive material has an adhesive projection projecting into the gap, and wherein the adhesive projection has an arch-shape.

5. The light emitting device according to claim 4, wherein the adhesive material is made of an inorganic adhesive material.

6. The light emitting device according to claim 1, wherein a number of the one or more light emitting elements is more than one, and wherein the upper surfaces of the light emitting elements are bonded to the lower surface of a single sheet of the light transmissive member.

7. The light emitting device according to claim 1, wherein the light transmissive member contains a phosphor.

8. The light emitting device according to claim 1, wherein the light transmissive member is formed into a convex shape from the lower surface to the upper surface of the light transmissive member, and has first lateral surfaces contiguous with the upper surface of the light transmissive member, second lateral surfaces contiguous with the lower surface, and the second upper surface contiguous with both the first lateral surfaces and the second lateral surfaces.

9. The light emitting device according to claim 1, further comprising:

an additional light reflective member sandwiched by the light reflective member and the one or more light emitting elements.

10. The light emitting device according to claim 9, wherein the light reflective member directly contacts the surfaces of the light transmissive member, and wherein the additional light reflective member directly contacts the lateral surfaces of the one or more light emitting elements and the additional light reflective member directly contacts the light reflective member.

11. The light emitting device according to claim 10, wherein the additional light reflective member and the light reflective member have different linear expansion coefficients, wherein the additional light reflective member has a lower linear expansion coefficient than the linear expansion coefficient of the light reflective member, and wherein the additional light reflective member is provided in a space between the one or more light emitting elements and the mounting board.

12. The light emitting device according to claim 9, wherein the additional light reflective member and the light reflective member have different linear expansion coefficients.

13. The light emitting device according to claim 12, wherein the additional light reflective member has a lower linear expansion coefficient than the linear expansion coefficient of the light reflective member.

14. The light emitting device according to claim 13, wherein the additional light reflective member is provided in a space between the one or more light emitting elements and the mounting board.

15. The light emitting device according to claim 1, wherein the mounting board has an anode and a cathode as conductive wiring patterns on the upper surface of the mounting board where the one or more light emitting elements are mounted.

16. The light emitting device according to claim 15, wherein a portion of the cathode and a portion of the anode are exposed from the light reflective member in the plan view.

17. The light emitting device according to claim 1, wherein the mounting board has a plate-like support member formed with an insulating material.

18. The light emitting device according to claim 17, wherein the mounting board includes a heat dissipation terminal that is electrically independent from the one or more light emitting elements.

19. The light emitting device according to claim 1, wherein the light transmissive member is formed of an inorganic material.

20. The light emitting device according to claim 1, wherein the mounting board has the upper surface and a lower surface that each has a set of electrode patterns.

* * * * *